US011509282B2

United States Patent
Nagatomo et al.

(10) Patent No.: US 11,509,282 B2
(45) Date of Patent: Nov. 22, 2022

(54) ACOUSTIC WAVE DEVICE

(71) Applicant: Murata Manufacturing Co., Ltd., Nagaokakyo (JP)

(72) Inventors: Shou Nagatomo, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 358 days.

(21) Appl. No.: 16/885,321

(22) Filed: May 28, 2020

(65) Prior Publication Data

US 2020/0295730 A1 Sep. 17, 2020

Related U.S. Application Data

(63) Continuation of application No. PCT/JP2018/042169, filed on Nov. 14, 2018.

(30) Foreign Application Priority Data

Dec. 8, 2017 (JP) .............................. JP2017-236239

(51) Int. Cl.
*H03H 9/05* (2006.01)
*H03H 9/02* (2006.01)
(Continued)

(52) U.S. Cl.
CPC .... *H03H 9/02228* (2013.01); *H03H 9/02559* (2013.01); *H03H 9/02842* (2013.01); *H03H 9/14541* (2013.01)

(58) Field of Classification Search
CPC .. H03H 9/02566; H03H 9/02574; H03H 9/05; H03H 9/058; H03H 9/145;
(Continued)

(56) References Cited

U.S. PATENT DOCUMENTS 7,105,980 B2 * 9/2006 Abbott .................. H03H 3/08
310/313 A
2018/0152170 A1 5/2018 Iwamoto

FOREIGN PATENT DOCUMENTS

JP 09-98058 A 4/1997
JP 2009-236674 A 10/2009
(Continued)

OTHER PUBLICATIONS

Official Communication issued in International Patent Application No. PCT/JP2018/042169, dated Jan. 29, 2019.

*Primary Examiner* — Hafizur Rahman
(74) *Attorney, Agent, or Firm* — Keating & Bennett, LLP

(57) ABSTRACT

An acoustic wave device includes a support substrate including silicon, a piezoelectric layer provided directly or indirectly on the support substrate, and an interdigital transducer (IDT) electrode provided on the piezoelectric layer. When a wavelength defined by an electrode finger pitch of the IDT electrode is λ, a thickness of the piezoelectric layer is about 1λ or less. $V_L$, which is an acoustic velocity of a longitudinal wave component of a bulk wave propagating through the piezoelectric layer, satisfies Unequal Equation (2) below in relation to an acoustic velocity $V_{Si\text{-}1}$ determined by Equation (1) below:

$V_{Si\text{-}1} = (V_2)^{1/2}$ (m/sec)  Equation (1), $V_{Si\text{-}1} \leq V_L$  Unequal Equation (2), $V_2$ in Equation (1) is a solution of Equation (3), and $Ax^3 + Bx^2 + Cx + D = 0$  Equation (3).

17 Claims, 12 Drawing Sheets

(51) Int. Cl.
  *H03H 9/72* (2006.01)
  *H03H 9/145* (2006.01)
  *H03H 9/25* (2006.01)
(58) Field of Classification Search
  CPC .. H03H 9/25; H03H 9/64; H03H 9/72; H03H 9/725
  USPC ............... 333/193–196, 133; 310/313 B
  See application file for complete search history.

(56) References Cited

FOREIGN PATENT DOCUMENTS

WO    2017/043394 A1    3/2017
WO    2017/209131 A1    12/2017

\* cited by examiner

S₀ MODE LAMB WAVES

S₁ MODE LAMB WAVES

A₀ MODE LAMB WAVES

A₁ MODE LAMB WAVES

SH₀ MODE

SH₁ MODE

ACOUSTIC WAVE DEVICE

CROSS REFERENCE TO RELATED APPLICATIONS

This application claims the benefit of priority to Japanese Patent Application No. 2017-236239 filed on Dec. 8, 2017 and is a Continuation Application of PCT Application No. PCT/JP2018/042169 filed on Nov. 14, 2018. The entire contents of each application are hereby incorporated herein by reference.

BACKGROUND OF THE INVENTION

1. Field of the Invention

The present invention is directed to an acoustic wave device with a support substrate including silicon (Si).

2. Description of the Related Art

There have been proposed various acoustic wave devices with a support substrate made of silicon. International Publication No. 2017/043394 discloses an acoustic wave device in which a crystal orientation of a silicon substrate is set to a specified crystal orientation in order to significantly reduce or prevent higher-order mode responses.

However, study by the inventors of preferred embodiments of the present invention has discovered that, in the acoustic wave device described in International Publication No. 2017/043394, depending on a state of a crystal orientation of a silicon substrate, spurious emissions due to responses of plate waves of a piezoelectric material are relatively large.

SUMMARY OF THE INVENTION

Preferred embodiments of the present invention provide acoustic wave devices that are each able to significantly reduce or prevent spurious modes.

An acoustic wave device according to a preferred embodiment of the present invention includes a support substrate made of silicon; a piezoelectric layer provided directly or indirectly on the support substrate; and an interdigital transducer (IDT) electrode provided on the piezoelectric layer, in which when a wavelength defined by an electrode finger pitch of the IDT electrode is $\lambda$, a thickness of the piezoelectric layer is about $1\lambda$ or less, and $V_L$, which is an acoustic velocity of a longitudinal wave component of a bulk wave propagating through the piezoelectric layer, satisfies Unequal Equation (2) below in relation to an acoustic velocity $V_{Si-1}$ determined by Equation (1) below:

$$V_{Si-1} = (V_2)^{1/2} \text{ (m/sec)} \quad \text{Equation (1),}$$

$$V_{Si-1} \leq V_L \quad \text{Unequal Equation (2), and}$$

$V_2$ in Equation (1) is a solution of Equation (3).

$$Ax^3 + Bx^2 + Cx + D = 0 \quad \text{Equation (3)}$$

$V_1$, $V_2$, and $V_3$, which are three solutions of Equation (3), have a relationship of $V_1 \leq V_2 \leq V_3$.

In Equation (3), A, B, C, and D are values determined by Equations (3A), (3B), (3C), and (3D) below, respectively:

$$A = -\rho^3 \quad \text{Equation (3A),}$$

$$B = \rho^2(L_{11} + L_{22} + L_{33}) \quad \text{Equation (3B),}$$

$$C = \rho(L_{21}^2 + L_{23}^2 + L_{31}^2 - L_{11} \cdot L_{33} - L_{22} \cdot L_{33} - L_{11} \cdot L_{22}) \quad \text{Equation (3C), and}$$

$$D = 2 \cdot L_{21} \cdot L_{23} \cdot L_{31} + L_{11} \cdot L_{22} \cdot L_{33} - L_{31}^2 \cdot L_{22} - L_{11} \cdot L_{23}^2 - L_{21}^2 \cdot L_{33} \quad \text{Equation (3D).}$$

Here, in Equations (3A), (3B), (3C), or (3D), $\rho$ represents the density (g/cm³) of silicon. In addition, $L_{11}$, $L_{22}$, $L_{33}$, $L_{21}$, $L_{31}$, and $L_{23}$ are values determined by Equations (4A), (4B), (4C), (4D), (4E), and (4F) below, respectively:

$$L_{11} = c_{11} \cdot a_1^2 + c_{44} \cdot a_2^2 + c_{44} \cdot a_3^2 \quad \text{Equation (4A),}$$

$$L_{22} = c_{44} \cdot a_1^2 + c_{11} \cdot a_2^2 + c_{44} \cdot a_3^2 \quad \text{Equation (4B),}$$

$$L_{33} = c_{44} \cdot a_1^2 + c_{44} \cdot a_2^2 + c_{11} \cdot a_3^2 \quad \text{Equation (4C),}$$

$$L_{21} = (c_{12} + c_{44}) \cdot a_2 \cdot a_1 \quad \text{Equation (4D),}$$

$$L_{31} = (c_{12} + c_{44}) \cdot a_1 \cdot a_3 \quad \text{Equation (4E), and}$$

$$L_{23} = (c_{44} + c_{12}) \cdot a_3 \cdot a_2 \quad \text{Equation (4F).}$$

Note that, in Equations (4A), (4B), (4C), (4D), (4E), and (4F), $c_{11}$, $c_{12}$, and $c_{44}$ are elastic constants (N/m²) of silicon, respectively, and $a_1$, $a_2$, and $a_3$ are values determined by Equations (5A), (5B), and (5C) below, respectively:

$$a_1 = \cos(\varphi) \cdot \cos(\psi) - \sin(\varphi) \cdot \cos(\theta) \cdot \sin(\psi) \quad \text{Equation (5A),}$$

$$a_2 = \sin(\varphi) \cdot \cos(\psi) + \cos(\varphi) \cdot \cos(\theta) \cdot \sin(\psi) \quad \text{Equation (5B), and}$$

$$a_3 = \sin(\theta) \cdot \sin(\psi) \quad \text{Equation (5C).}$$

Note that $\varphi$, $\theta$, and $\psi$ in Equations (5A), (5B), and (5C) are $\varphi$, $\theta$, and $\psi$ in a silicon crystal orientation ($\varphi$, $\theta$, $\psi$).

According to acoustic wave devices of preferred embodiments of the present invention, spurious modes are able to be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

Each preferred embodiment described in the specification is an example, and partial replacement or combination of components, elements, and features between the different preferred embodiments may be provided.

Figure 1A:
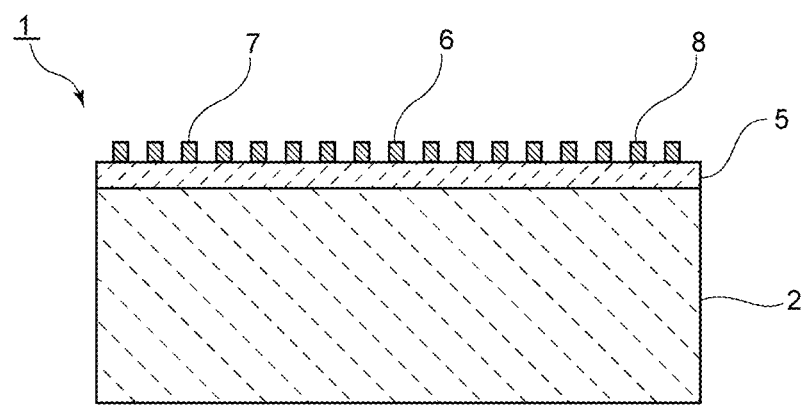
FIG. 1A is a front sectional view of an acoustic wave device according to Preferred Embodiment 1 of the present invention.
Figure 1B:
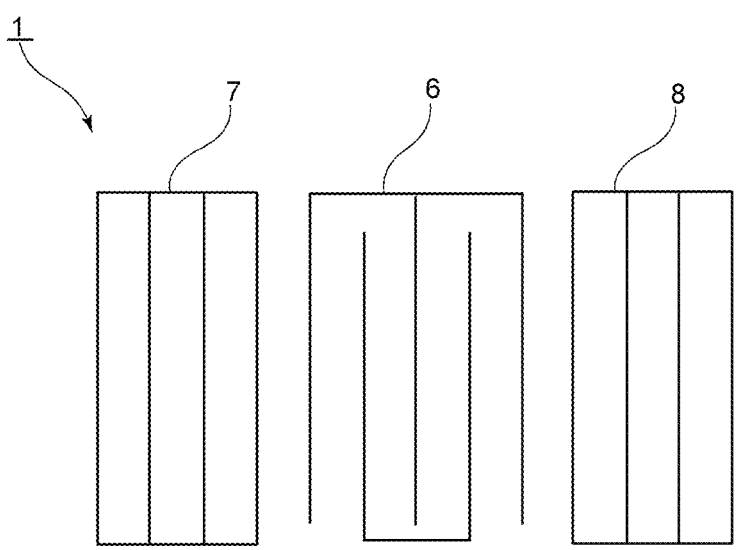
FIG. 1B is a plan view showing an electrode structure of the acoustic wave device according to Preferred Embodiment 1 of the present invention.
Figure 2A:
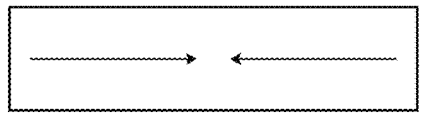
FIGS. 2A to 2F are diagrams showing examples of plate wave modes.
Figure 2B:
Figure 2C:
Figure 2D:
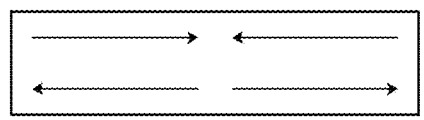
Figure 2E:
Figure 2F:

FIG. 1A is a front sectional view of an acoustic wave device according to Preferred Embodiment 1 of the present invention. FIG. 1B is a plan view showing an electrode structure of the acoustic wave device according to Preferred Embodiment 1.

An acoustic wave device 1 includes a support substrate 2 made of silicon. In Preferred Embodiment 1, a piezoelectric layer 5 is directly laminated on the support substrate 2. In Preferred Embodiment 1, the piezoelectric layer 5 is preferably made of, for example, lithium tantalate. Euler angles ($\varphi$, $\theta$, $\psi$) of the piezoelectric layer 5 are not particularly limited, but in Preferred Embodiment 1, the Euler angles (0°, 140°, 0°) are preferably used. Note that the piezoelectric layer 5 may be made of, for example, lithium niobate, aluminum nitride, or the like.

An interdigital transducer (IDT) electrode 6 is provided on the piezoelectric layer 5. The IDT electrode 6 is provided on an upper surface of the piezoelectric layer 5, but may be provided also on a lower surface. The IDT electrode 6 includes a plurality of electrode fingers. An acoustic wave is excited by applying an AC voltage to the IDT electrode 6. A reflector 7 and a reflector 8 are provided on each side of the IDT electrode 6 in an acoustic wave propagation direction as a direction orthogonal or substantially orthogonal to a direction in which the electrode fingers extend. The IDT electrode 6, the reflector 7, and the reflector 8 are preferably made of, for example, Al. Note that the material of the IDT electrode 6, the reflector 7, and the reflector 8 is not limited to the above. The IDT electrode 6, the reflector 7, and the reflector 8 may be defined by a laminated metal film in which a plurality of metal layers are laminated, or may include a single layer metal film.

As shown in FIG. 1B, the acoustic wave device 1 is an acoustic wave resonator including the IDT electrode 6, the reflector 7, and the reflector 8.

Note that a dielectric film may be provided on the IDT electrode 6.

Here, when a wavelength defined by an electrode finger pitch of the IDT electrode 6 is $\lambda$, a thickness of the piezoelectric layer 5 is preferably about 0.20$\lambda$, for example. A thickness of the IDT electrode 6 is preferably about 0.08$\lambda$, for example. The wavelength $\lambda$ is not particularly limited, but is preferably, for example, about 1 µm in Preferred Embodiment 1. Note that the thicknesses of the piezoelectric layer 5 and the IDT electrode 6 are not limited to the above. The thickness of the piezoelectric layer 5 is preferably about 1$\lambda$ or less, for example. Thus, a mode is able to be excited.

FIGS. 2A to 2F are diagrams showing examples of plate wave modes. In FIGS. 2A to 2D, directions of arrows indicate displacement directions of the acoustic wave, and in FIGS. 2E and 2F, sheet thickness directions indicate displacement directions of the acoustic wave.

The plate waves are classified into Lamb waves (components in an acoustic wave propagation direction and a thickness direction of the piezoelectric material are main components) and SH (Shear Horizontal) waves (an SH component is a main component) depending on displacement components. Further, the Lamb waves are classified into a symmetric mode (S mode) and an antisymmetric mode (A mode). Note that, when the piezoelectric material is folded back at a center line in the thickness direction, one in which displacements overlap is defined as a symmetric mode, and one in which displacement directions are opposite to each other is defined as an antisymmetric mode. A subscript number in a mode name indicates the number of nodes in the thickness direction. For example, $A_1$ mode Lamb waves are first order antisymmetric mode Lamb waves. Each of the above modes may be excited independently or some of them may be excited as a mixed mode. When acoustic velocities of respective modes are close, they may be excited as a mixed mode.

Figure 3:
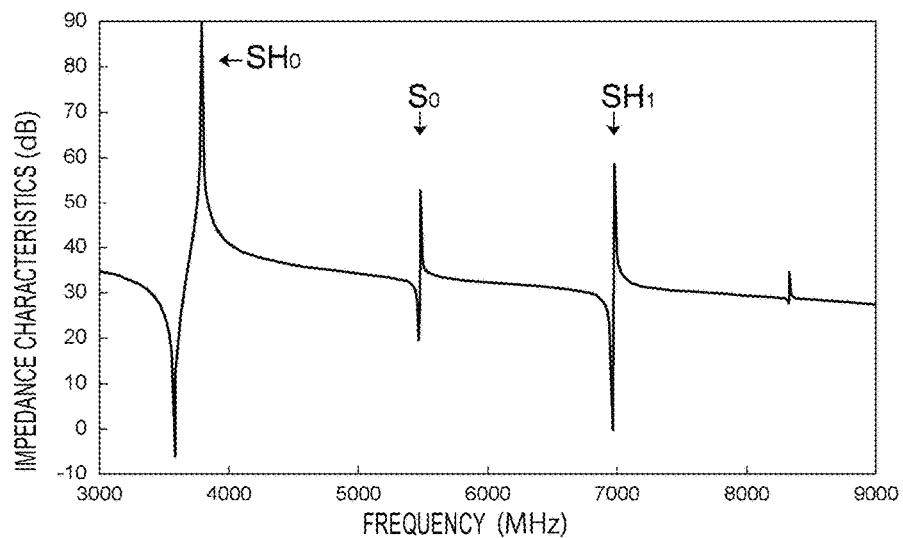
FIG. 3 is a diagram showing an example in which the plate waves in each mode are excited.

FIG. 3 is a diagram showing an example in which the plate waves in each mode are excited. Note that FIG. 3 is a diagram showing impedance frequency characteristics of Comparative Example 1. Comparative Example 1 is different from Preferred Embodiment 1 in that the support substrate 2 is not included.

In Preferred Embodiment 1, an $SH_0$ mode is used as a main mode. In the piezoelectric layer 5 having a thin thickness, modes other than the $SH_0$ mode are also excited. As shown in FIG. 3, for example, an $S_0$ mode and an $SH_1$ mode are excited. Responses of modes other than the main mode are spurious emissions. When attempting to confine the $SH_0$ mode to the piezoelectric layer 5 side, the plate waves which are modes other than the $SH_0$ mode are also substantially confined to the piezoelectric layer 5 side. Therefore, it has been difficult to provide both confinement of the $SH_0$ mode and a significant reduction or prevention of spurious emissions.

On the other hand, when an acoustic velocity of a bulk wave propagating through the support substrate 2 is lower than an acoustic velocity of a mode, which is a spurious emission, propagating through the piezoelectric layer 5, the mode which is a spurious emission may be leaked to the support substrate 2 side, and a spurious emission is able to be significantly reduced or prevented. Note that, in the following, a mode which is a spurious emission or a spurious emission will be described as a spurious mode in some cases. Here, the acoustic velocity of the bulk wave propagating through the support substrate 2 made of silicon varies depending on a silicon crystal orientation ($\varphi$, $\theta$, $\psi$). Features of Preferred Embodiment 1 include the following. The support substrate 2 is made of silicon. The relationships in the following Equations and Unequal Equation (1), (2), (3), (3A), (3B), (3C), (3D), (4A), (4B), (4C), (4D), (4E), (4F), (5A), (5B), and (5C) are satisfied. Thus, the main mode is able to be substantially confined to the piezoelectric layer 5 side, and the spurious modes are able to be significantly reduced or prevented. Hereinafter, features of Preferred Embodiment 1 will be described.

An acoustic velocity of the $SH_0$ mode propagating through the piezoelectric layer 5 is represented by $V_{SH0}$, an acoustic velocity of a longitudinal wave component of the bulk wave propagating through the piezoelectric layer 5 in the direction defined by the IDT electrode 6 is represented by $V_L$, and an acoustic velocity of the bulk wave propagating through the support substrate 2 is represented by $V_{Si-1}$. More specifically, the acoustic velocity $V_{Si-1}$ is an acoustic velocity of a transversal wave propagating through the support substrate 2. The acoustic velocity $V_{Si-1}$ satisfies the relationship in the following Equation (1). The acoustic velocity $V_{Si-1}$, the acoustic velocity $V_{SH0}$, and the acoustic velocity $V_L$ satisfy the relationship in the following Unequal Equation (2).

$$V_{Si-1} = (V_2)^{1/2} \text{ (m/sec)} \qquad \text{Equation (1)}$$

$$V_{Si-1} \leq V_L \qquad \text{Unequal Equation (2)}$$

The acoustic velocity $V_L$ of the longitudinal wave component of the bulk wave propagating through the piezoelectric layer 5 defines an acoustic velocity of the $S_0$ mode propagating through the piezoelectric layer 5. In Preferred Embodiment 1, as shown with reference to Comparative Example 1 in FIG. 3, the slowest mode among the modes other than the $SH_0$ mode is the $S_0$ mode. Since the relationship of $V_{Si-1} \leq V_L$ is satisfied, the acoustic velocities of all modes other than the $SH_0$ mode propagating through the piezoelectric layer 5 are higher than the acoustic velocity $V_{Si-1}$ of the bulk wave propagating through the support substrate 2. Therefore, the spurious modes may be leaked to the support substrate 2 side, and the spurious modes are able to be significantly reduced or prevented.

More specifically, the acoustic velocity $V_L$ defines the maximum acoustic velocity of the $S_0$ mode propagating through the piezoelectric layer 5. Even when the acoustic velocity of the $S_0$ mode does not match the acoustic velocity $V_L$, a difference between the two acoustic velocities is not large, and the effect of leaking the $S_0$ mode to the support substrate 2 side is able to be provided. Further, modes in which acoustic velocities are higher than the acoustic velocity $V_L$ may be leaked to the support substrate 2 side. Therefore, the spurious modes are able to be significantly reduced or prevented.

$V_2$ in Equation (1) is a solution of the following Equation (3).

$$Ax^3 + Bx^2 + Cx + D = 0 \qquad \text{Equation (3)}$$

$V_1$, $V_2$, and $V_3$, which are three solutions of Equation (3), have a relationship of $V_1 \leq V_2 \leq V_3$.

In Equation (1), $V_{Si-1}$ is defined as a function of $V_2$ that is at least $V_1$ or more among the above three solutions. The acoustic velocity $V_{Si-1}$ is an acoustic velocity of a fast transversal wave propagating through the support substrate 2. Therefore, $(V_1)^{1/2} \leq (V_2)^{1/2} = V_{Si-1} \leq V_L$ is able to be satisfied, and the spurious modes are able to be more reliably leaked to the support substrate 2 side.

In Equation (3), A, B, C, and D are values determined by the following Equations (3A), (3B), (3C), and (3D), respectively.

$$A = -\rho^3 \qquad \text{Equation (3A)}$$

$$B = \rho^2(L_{11} + L_{22} + L_{33}) \qquad \text{Equation (3B)}$$

$$C = \rho(L_{21}^2 + L_{23}^2 + L_{31}^2 - L_{11} \cdot L_{33} - L_{22} \cdot L_{33} - L_{11} \cdot L_{22}) \qquad \text{Equation (3C)}$$

$$D = 2 \cdot L_{21} \cdot L_{23} \cdot L_{31} + L_{11} \cdot L_{22} \cdot L_{33} - L_{31}^2 \cdot L_{22} - L_{11} \cdot L_{23}^2 - L_{21}^2 \cdot L_{33} \qquad \text{Equation (3D).}$$

Here, in Equations (3A), (3B), (3C), or (3D), $\rho$ represents the density (g/cm³) of silicon. In addition, $L_{11}$, $L_{22}$, $L_{33}$, $L_{21}$, $L_{31}$, and $L_{23}$ are values determined by the following Equations (4A), (4B), (4C), (4D), (4E), and (4F), respectively.

$$L_{11} = c_{11} \cdot a_1^2 + c_{44} \cdot a_2^2 + c_{44} \cdot a_3^2 \qquad \text{Equation (4A)}$$

$$L_{22} = c_{44} \cdot a_1^2 + c_{11} \cdot a_2^2 + c_{44} \cdot a_3^2 \qquad \text{Equation (4B)}$$

$$L_{33} = c_{44} \cdot a_1^2 + c_{44} \cdot a_2^2 + c_{11} \cdot a_3^2 \qquad \text{Equation (4C)}$$

$$L_{21} = (c_{12} + c_{44}) \cdot a_2 \cdot a_1 \qquad \text{Equation (4D)}$$

$$L_{31} = (c_{12} + c_{44}) \cdot a_1 \cdot a_3 \qquad \text{Equation (4E)}$$

$$L_{23} = (c_{44} + c_{12}) \cdot a_3 \cdot a_2 \qquad \text{Equation (4F)}$$

Note that, in Equations (4A), (4B), (4C), (4D), (4E), and (4F), $c_{11}$, $c_{12}$, and $c_{44}$ are elastic constants (N/m²) of silicon, respectively, and $a_1$, $a_2$, and $a_3$ are values determined by the following Equations (5A), (5B), and (5C), respectively.

$$a_1 = \cos(\varphi) \cdot \cos(\psi) - \sin(\varphi) \cdot \cos(\theta) \cdot \sin(\psi) \qquad \text{Equation (5A)}$$

$$a_2 = \sin(\varphi) \cdot \cos(\psi) + \cos(\varphi) \cdot \cos(\theta) \cdot \sin(\psi) \qquad \text{Equation (5B)}$$

$$a_3 = \sin(\theta) \cdot \sin(\psi) \qquad \text{Equation (5C)}$$

Note that $\varphi$, $\theta$, and $\psi$ in Equations (5A), (5B), and (5C) are $\varphi$, $\theta$, and $\psi$ in the silicon crystal orientation ($\varphi$, $\theta$, $\psi$).

By selecting values of the silicon crystal orientation ($\varphi$, $\theta$, $\psi$) to satisfy Unequal Equation (2), the $SH_0$ mode may be substantially confined to the piezoelectric layer 5 side, and the spurious modes are able to be significantly reduced or prevented.

The silicon crystal orientation ($\varphi$, $\theta$, $\psi$) will be described with reference to FIG. 4.

Figure 4:
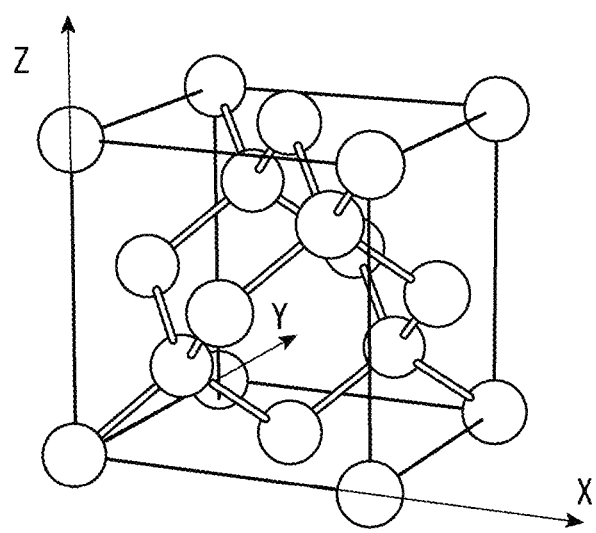
FIG. 4 is a diagram showing a definition of a silicon crystal orientation.

FIG. 4 is a diagram showing a definition of the silicon crystal orientation.

In the silicon crystal structure shown in FIG. 4, when a rotation direction of a right-hand screw is positive, Z-X-Z is taken as a rotation axis. The crystal orientation (φ, θ, ψ) refers to an orientation obtained as a result of rotating (X, Y, Z) by "φ" around the Z-axis to obtain $(X_1, Y_1, Z_1)$, rotating $(X_1, Y_1, Z_1)$ by "θ" around the $X_1$-axis to obtain $(X_2, Y_2, Z_2)$, and rotating $(X_2, Y_2, Z_2)$ by "ψ" around the $Z_2$-axis to obtain $(X_3, Y_3, Z_3)$.

Figure 5:
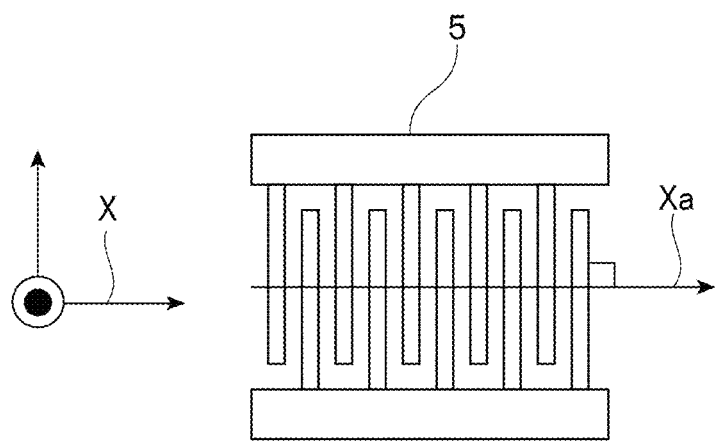
FIG. 5 is a plan view showing relation between an X-axis of the silicon crystal at a silicon crystal orientation (0°, 0°, 0°) and a direction in which electrode fingers of an IDT electrode extend.

As shown in FIG. 5, at a silicon crystal orientation (0°, 0°, 0°), an X-axis of the silicon crystal and a direction Xa orthogonal or substantially orthogonal to the direction in which the electrode fingers of the IDT electrode extend are in a same or substantially a same direction.

The elastic constants $c_{11}$, $c_{12}$, and $c_{44}$ of silicon are values defined as follows.

Strain S and stress T of an elastic material are in a proportional relationship. This proportional relationship is represented by the following matrix.

$$\begin{bmatrix} T_1 \\ T_2 \\ T_3 \\ T_4 \\ T_5 \\ T_6 \end{bmatrix} = \begin{bmatrix} c_{11} & c_{12} & c_{13} & c_{14} & c_{15} & c_{16} \\ c_{21} & c_{22} & c_{23} & c_{24} & c_{25} & c_{26} \\ c_{31} & c_{32} & c_{33} & c_{34} & c_{35} & c_{36} \\ c_{41} & c_{42} & c_{43} & c_{44} & c_{45} & c_{46} \\ c_{51} & c_{52} & c_{53} & c_{54} & c_{55} & c_{56} \\ c_{61} & c_{62} & c_{63} & c_{64} & c_{65} & c_{66} \end{bmatrix} \begin{bmatrix} S_1 \\ S_2 \\ S_3 \\ S_4 \\ S_5 \\ S_6 \end{bmatrix}$$

A proportional constant $(c_{ij})$ in this equation is referred to as an elastic constant. The elastic constant $c_{ij}$ depends on a crystal system to which a solid belongs. For example, silicon may be represented by the following three independent values due to symmetry of the crystal.
Elastic Constant of Silicon (N/m²)

$$\begin{bmatrix} c_{11} & c_{12} & c_{12} & 0 & 0 & 0 \\ c_{12} & c_{11} & c_{12} & 0 & 0 & 0 \\ c_{12} & c_{12} & c_{11} & 0 & 0 & 0 \\ 0 & 0 & 0 & c_{44} & 0 & 0 \\ 0 & 0 & 0 & 0 & c_{44} & 0 \\ 0 & 0 & 0 & 0 & 0 & c_{44} \end{bmatrix}$$

The above-described elastic constants $c_{11}$, $c_{12}$, and $c_{44}$ are the elastic constants of silicon defined as described above. Note that the elastic constants of silicon $c_{11}$=1.674E+11 (N/m²), $c_{12}$=6.523E+10 (N/m²), $c_{44}$=7.957E+10 (N/m²) (H. J. McSkimin, et al., "Measurement of the Elastic Constants of Silicon Single Crystals and Their Thermal Constants", Phys. Rev. Vol. 83, p. 1080(L) (1951)). The density ρ of silicon is 2.331 (g/cm³).

Hereinafter, the advantageous effects of Preferred Embodiment 1 will be further explained by comparing Preferred Embodiment 1 with Comparative Example 2. Note that Comparative Example 2 is different from Preferred Embodiment 1 in a crystal orientation of the support substrate.

Figure 6:
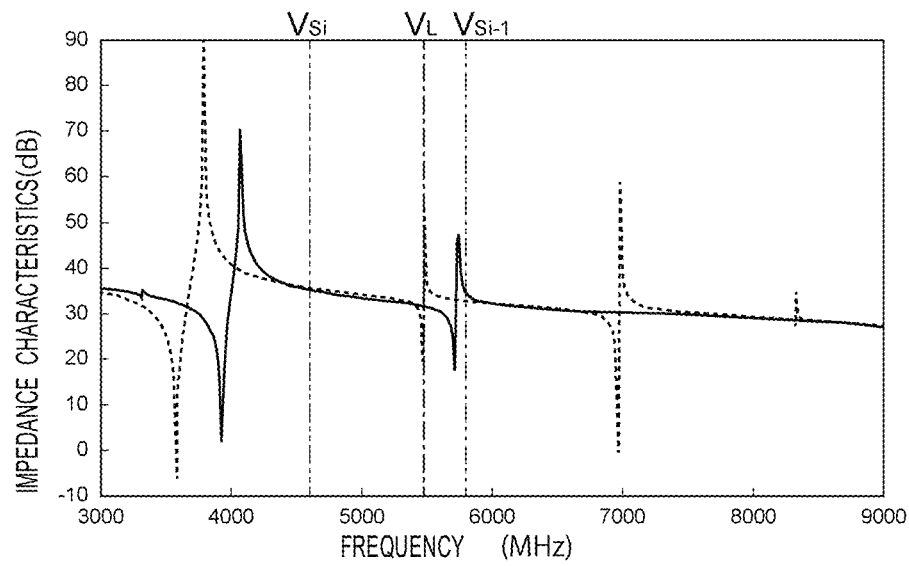
FIG. 6 is a diagram showing impedance frequency characteristics and relation between respective acoustic velocities of acoustic wave devices of Comparative Example 1 and Comparative Example 2.
Figure 7:
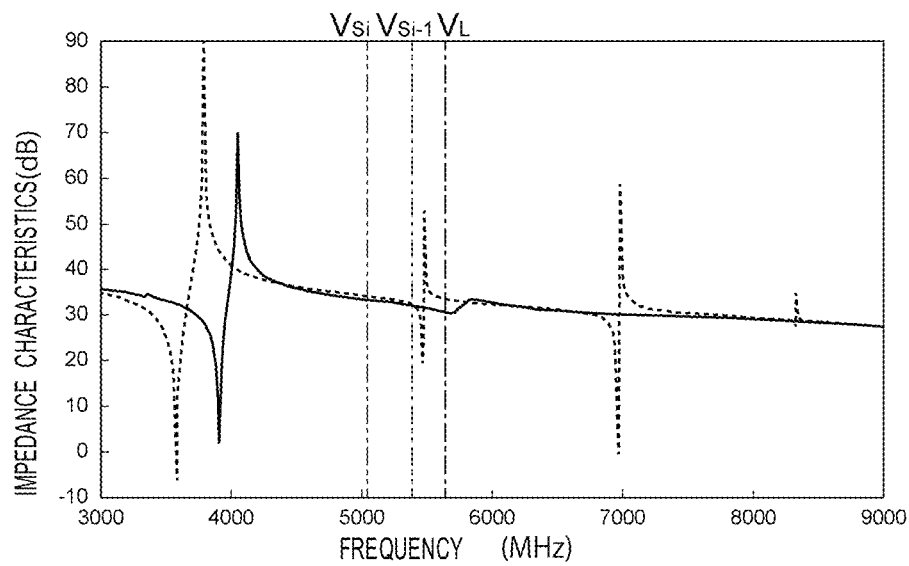
FIG. 7 is a diagram showing impedance frequency characteristics and relation between respective acoustic velocities of the acoustic wave devices of Preferred Embodiment 1 and Comparative Example 1 of the present invention.

Conditions of the acoustic wave device of Preferred Embodiment 1 are as follows.
Piezoelectric layer 5: material lithium tantalate, Euler angles (0°, 140°, 0°), thickness about 0.20λ
Support substrate 2: material silicon, crystal orientation (−45°, −54.7°, 30°)
IDT electrode 6: material Al, thickness about 0.08λ
Wavelength λ: about 1 μm Conditions of an acoustic wave device of Comparative Example 2 are as follows.
Piezoelectric layer 5: material lithium tantalate, Euler angles (0°, 140°, 0°), thickness about 0.20λ
Support substrate: material silicon, crystal orientation (−45°, −54.7°, 0°)
IDT electrode 6: material Al, thickness about 0.08λ,
Wavelength λ: about 1 μm FIG. 6 is a diagram showing impedance frequency characteristics and a relationship between respective acoustic velocities of acoustic wave devices of Comparative Example 1 and Comparative Example 2. FIG. 7 is a diagram showing impedance frequency characteristics and a relationship between respective acoustic velocities of the acoustic wave devices of Preferred Embodiment 1 and Comparative Example 1. In FIG. 6, a solid line indicates a result of Comparative Example 2, and a broken line indicates a result of Comparative Example 1. In FIG. 7, a solid line indicates a result of Preferred Embodiment 1, and a broken line indicates a result of Comparative Example 1. Since the wavelength λ is about 1 μm in Preferred Embodiment 1 and Comparative Example 2, the horizontal axis in FIGS. 6 and 7 is also an index of acoustic velocity (m/sec). For example, in a case of about 5000 MHz, about 5000 m/sec is indicated. In FIGS. 6 and 7, a long and short dashed line indicates the acoustic velocity $V_L$, and long and double-short dashed lines indicate the acoustic velocity $V_{Si-1}$ and an acoustic velocity $V_{Si}$ described later. The same or similar features apply to each of drawings which indicate relationships between the acoustic velocities described later.

As shown in FIG. 6, in Comparative Example 2, $V_{Si} \leq V_L \leq V_{Si-1}$ is indicated. Note that $V_{Si}$ represents an acoustic velocity of a slow transversal wave propagating through the support substrate. The acoustic velocity $V_L$ of the longitudinal wave component of the bulk wave propagating through the piezoelectric layer 5 is higher than the acoustic velocity $V_{Si}$ of the slow transversal wave propagating through the support substrate, but lower than the acoustic velocity $V_{Si-1}$ of the fast transversal wave propagating through the support substrate. Therefore, the $S_0$ mode is substantially confined to the piezoelectric layer 5 side, and a spurious emission due to the $S_0$ mode occurs around 5700 MHz.

Note that in Comparative Example 2, the piezoelectric layer 5 is laminated on the support substrate in which an acoustic velocity of a transversal wave propagating therethrough is high. Therefore, the spurious emission due to the $S_0$ mode in Comparative Example 2 occurs on a higher frequency side than Comparative Example 1 including no support substrate 2.

In Preferred Embodiment 1, as shown in FIG. 7, spurious emissions due to the $S_0$ mode and the modes other than the $S_0$ mode are significantly reduced or prevented. In Preferred Embodiment 1, since the crystal orientation of the support substrate 2 is selected to satisfy $V_{Si} \leq V_{Si-1} \leq V_L$, plate waves in modes other than the $SH_0$ mode may be leaked to the support substrate 2 side. Therefore, the spurious modes are able to be significantly reduced or prevented.

The acoustic velocity $V_L$ of the longitudinal wave component of the bulk wave propagating through the piezoelectric layer 5 preferably satisfies the following Unequal Equation (7) in relation to an acoustic velocity $V_{Si-2}$ determined by the following Equation (6), for example. Note that an acoustic velocity of the bulk wave propagating through the support substrate 2 is defined as the above-described acoustic velocity $V_{Si-2}$. More specifically, the acoustic velocity $V_{Si-2}$ is an acoustic velocity of a transversal wave propagating through the support substrate 2.

$$V_{Si-2} = (V_3)^{1/2} \text{ (m/sec)} \quad \text{Equation (6)}$$

$$V_{Si-2} \leq V_L \quad \text{Unequal Equation (7)}$$

Since the three solutions $V_1$, $V_2$, and $V_3$ of the above Equation (3) have a relationship of $V_1 \leq V_2 \leq V_3$, the acoustic velocity $V_{Si-2}$ is substantially equal to or higher than the acoustic velocity $V_{Si-1}$. When Unequal Equation (7) is satisfied, since the acoustic velocity $V_L$ is higher than the acoustic velocity $V_{Si-2}$, the plate waves in modes other than the $SH_0$ mode may be more reliably leaked to the support substrate 2 side, and the spurious modes are able to be significantly reduced or prevented.

When the acoustic velocity of the bulk wave propagating through the support substrate 2 is higher than the acoustic velocity of the $SH_0$ mode propagating through the piezoelectric layer 5, the $SH_0$ mode is able to be substantially confined to the piezoelectric layer 5 side. Accordingly, the acoustic velocity $V_{SH0}$ of the $SH_0$ mode propagating through the piezoelectric layer 5 and the acoustic velocity $V_L$ of the longitudinal wave component of the bulk wave propagating through the piezoelectric layer 5, satisfy the following Unequal Equation (8) in relation to the acoustic velocity $V_{Si-1}$ determined by above Unequal equation (2).

$$V_{SH0} \leq V_{Si-1} \leq V_L \quad \text{Unequal Equation (8)}$$

Note that, also in a case where Unequal Equation (8) is satisfied in Preferred Embodiment 1, a relationship between $V_{Si}$, $V_{Si-1}$, and $V_L$ is as follows.

$$V_{Si} \leq V_{Si-1} \leq V_L$$

Also, the relationship in Unequal Equation (7) is preferably satisfied, for example.

$$V_{Si-2} \leq V_L \quad \text{Unequal Equation (7)}$$

Figure 8:
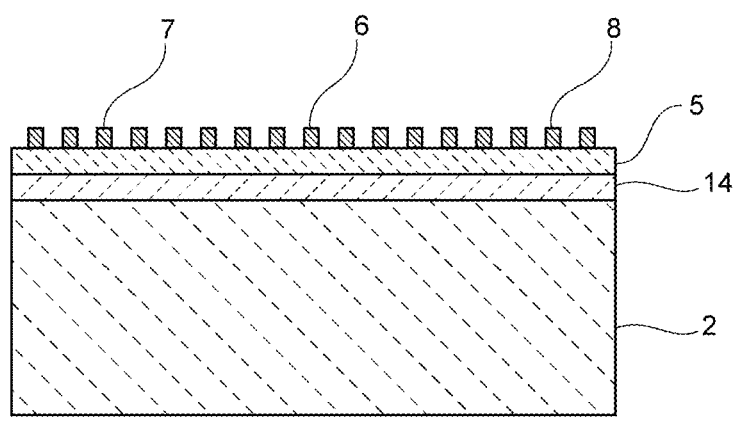
FIG. 8 is a front sectional view of an acoustic wave device according to Preferred Embodiment 2 of the present invention.

FIG. 8 is a front sectional view of an acoustic wave device according to Preferred Embodiment 2.

Preferred Embodiment 2 is different from Preferred Embodiment 1 in that between the support substrate 2 and the piezoelectric layer 5, a low-acoustic-velocity film 14 is provided in which the acoustic velocity of the bulk wave propagating therethrough is lower than the acoustic velocity of the bulk wave propagating through the piezoelectric layer 5. As described above, in Preferred Embodiment 2, the piezoelectric layer 5 is indirectly provided on the support substrate 2. The piezoelectric layer 5 and a crystal orientation of the support substrate 2 are also different from those of Preferred Embodiment 1. Except for the above points, the acoustic wave device of Preferred Embodiment 2 includes the same or similar features as the acoustic wave device 1 of Preferred Embodiment 1.

The low-acoustic-velocity film 14 is made of silicon oxide represented by $SiO_x$. More specifically, the low-acoustic-velocity film 14 is preferably made of, for example, $SiO_2$. Note that the low-acoustic-velocity film 14 may be made of silicon oxide in which x is a positive number other than 2. Alternatively, the low-acoustic-velocity film 14 may be made of a material mainly including, for example, glass, silicon oxynitride, tantalum oxide, or a compound provided by adding fluorine, carbon, or boron to silicon oxide, or the like. The material of the low-acoustic-velocity film 14 is preferably, for example, a material having a relatively low acoustic velocity. However, the low-acoustic-velocity film 14 preferably includes silicon oxide, for example. Thus, frequency temperature characteristics are able to be significantly improved.

A thickness of the low-acoustic-velocity film 14 is not particularly limited, but is preferably, for example, about $0.335\lambda$, in Preferred Embodiment 2. The thickness of the low-acoustic-velocity film 14 is preferably about $2\lambda$ or less, for example. By adjusting the thickness of the low-acoustic-velocity film 14 at about $2\lambda$ or less, an electromechanical coupling coefficient is able to be easily adjusted.

Conditions of the acoustic wave device of Preferred Embodiment 2 are as follows.

Piezoelectric layer 5: material lithium tantalate, cut-angles 50° Y, thickness about $0.30\lambda$ Support substrate 2: material silicon, crystal orientation (−45°, −90°, 35°)

Low-acoustic-velocity film 14: material $SiO_2$, thickness about $0.335\lambda$

IDT electrode 6: material Al, thickness about $0.08\lambda$

Wavelength $\lambda$: about 1 μm

The acoustic wave device of Preferred Embodiment 2 includes a multilayer body including the support substrate 2 which has a higher acoustic velocity of the bulk wave propagating therethrough than the $SH_0$ mode acoustic velocity propagating through the piezoelectric layer 5, the low-acoustic-velocity film 14, and the piezoelectric layer 5. Therefore, the $SH_0$ mode is able to be further substantially confined to the piezoelectric layer 5 side.

Here, when the low-acoustic-velocity film and the piezoelectric layer are laminated, the $SH_1$ mode and the like may shift to a lower frequency side. This is explained by Comparative Example 3. Note that Comparative Example 3 is different from Preferred Embodiment 2 in that Comparative Example 3 does not include a support substrate.

Figure 9:
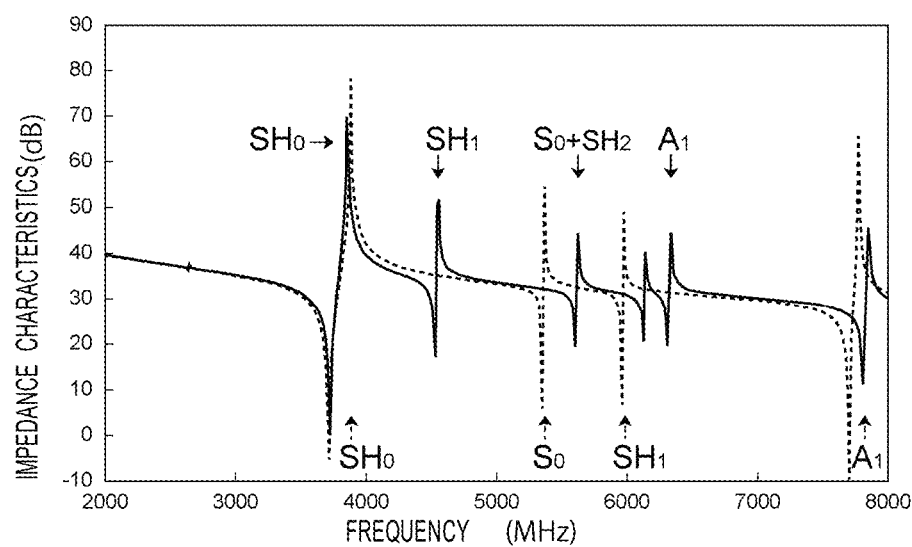
FIG. 9 is a diagram showing impedance frequency characteristics of the acoustic wave devices of Comparative Example 1 and Comparative Example 3.

FIG. 9 is a diagram showing impedance frequency characteristics of the acoustic wave devices of Comparative Example 1 and Comparative Example 3. In FIG. 9, a solid line indicates a result of Comparative Example 3, and a broken line indicates a result of Comparative Example 1.

As shown in FIG. 9, in Comparative Example 3 in which the low-acoustic-velocity film 14 and the piezoelectric layer 5 are laminated, the $SH_1$ mode and the $A_1$ mode occur on the low frequency side, as compared with Comparative Example 1 having no low-acoustic-velocity film 14. Note that an $S_0$ mode of Comparative Example 3 is mixed with an $SH_2$ mode moved to the lower frequency side, and slightly shifts to the higher frequency side than an $S_0$ mode of Comparative Example 1.

Also in a case where the low-acoustic-velocity film 14 and the piezoelectric layer 5 are laminated, the spurious modes are able to be significantly reduced or prevented in Preferred Embodiment 2. This will be explained by comparing Preferred Embodiment 2 with Comparative Example 4. Note that Comparative Example 4 is different from Preferred Embodiment 2 in that a crystal orientation of the support substrate is a crystal orientation (0°, 0°, 0°).

Figure 10:
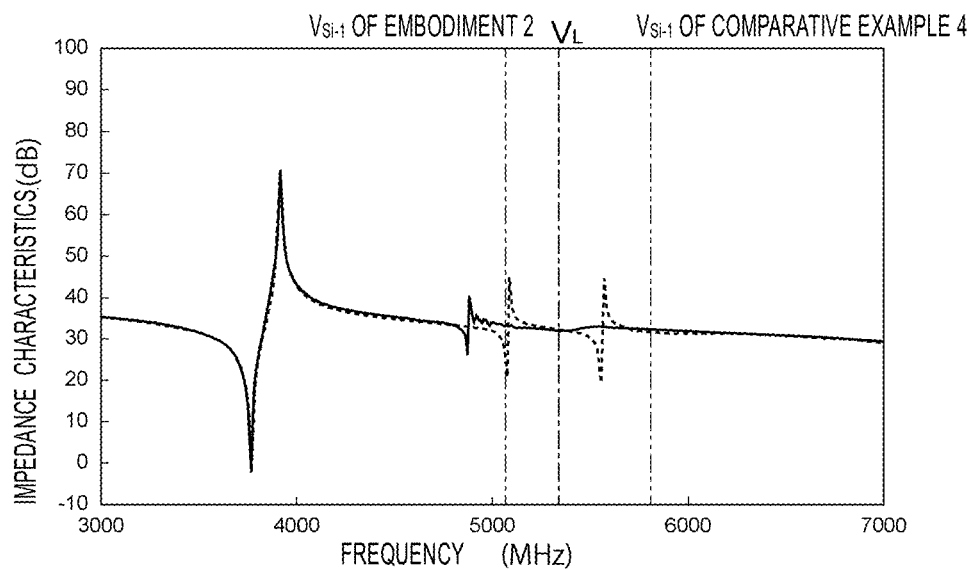
FIG. 10 is a diagram showing impedance frequency characteristics of acoustic wave devices of Preferred Embodiment 2 and Comparative Example 4 of the present invention.

FIG. 10 is a diagram showing impedance frequency characteristics of acoustic wave devices of Preferred Embodiment 2 and Comparative Example 4. In FIG. 10, a solid line indicates a result of Preferred Embodiment 2, and a broken line indicates a result of Comparative Example 4. A long and short dashed line indicates the $V_L$, and long and double-short dashed lines indicate the $V_{Si-1}$.

In Comparative Example 4, a large spurious emission due to the mixed mode of the $S_0$ mode and the $SH_2$ mode occurs around 5600 MHz. On the other hand, in Preferred Embodiment 2, a spurious emission due to the mixed mode of the $S_0$ mode and the $SH_2$ mode is significantly reduced or prevented. In Preferred Embodiment 2, the acoustic velocity $V_{Si-1}$ is lower than that of Comparative Example 4, and is set to about 5100 m/sec. As described above, since the crystal orientation of the support substrate 2 is selected to satisfy Unequal Equation (2), the spurious modes are able to be significantly reduced or prevented.

$$V_{Si-1} \leq V_L \quad \text{Unequal Equation (2)}$$

Further, the thickness of the low-acoustic-velocity film 14 is preferably substantially equal to or less than the thickness of the piezoelectric layer 5, for example. Accordingly, the spurious modes are able to be further significantly reduced or prevented. This will be explained below.

A plurality of acoustic wave devices each including the features of Preferred Embodiment 2 were manufactured with different thicknesses of the low-acoustic-velocity film.

Conditions for respective acoustic wave devices including the features of Preferred Embodiment 2 are as follows.

Figure 19:
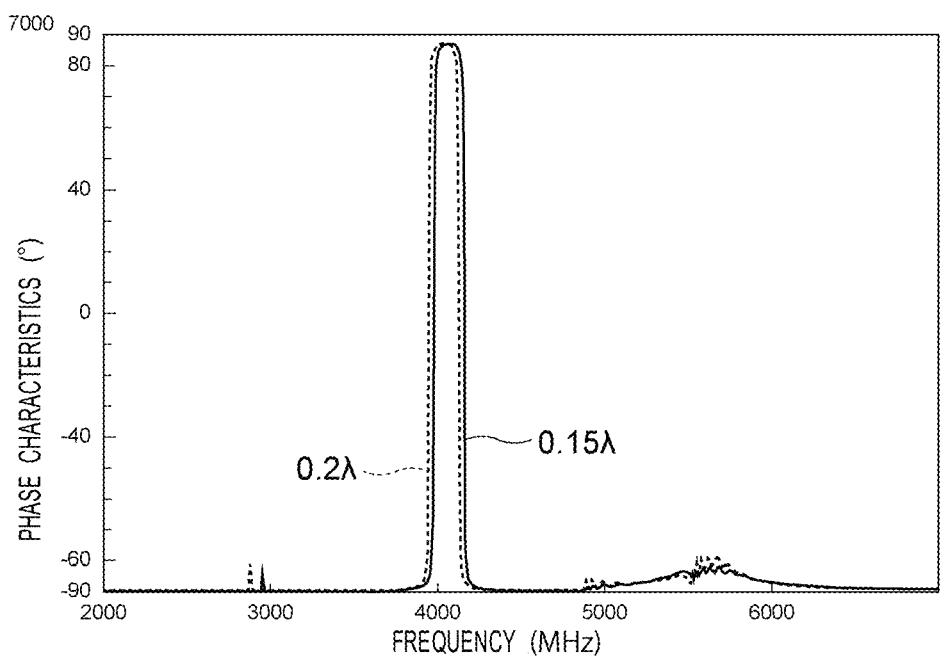
FIG. 19 is a diagram showing phase characteristics of respective acoustic wave devices including the features of Preferred Embodiment 2 of the present invention.
Figure 20:
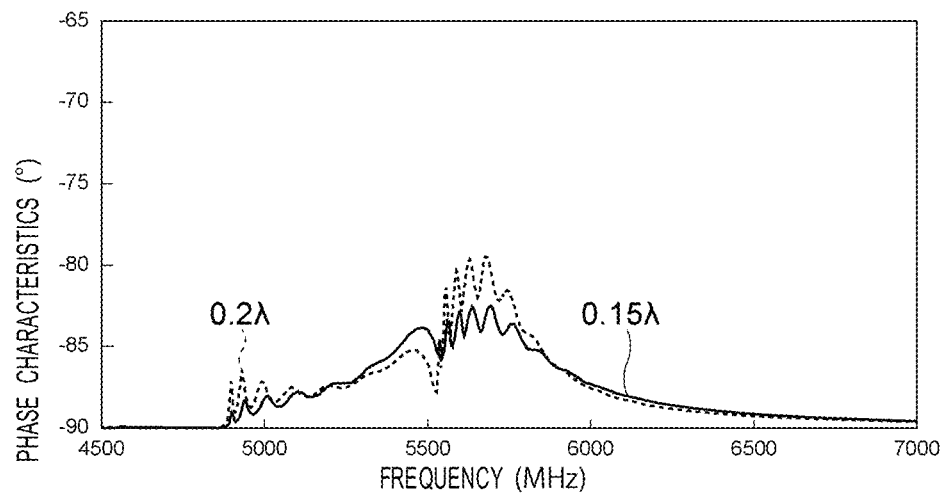
FIG. 20 is an enlarged view showing the phase characteristics of the respective acoustic wave devices including the features of Preferred Embodiment 2 of the present invention.

Piezoelectric layer 5: material lithium tantalate, cut-angles 50° Y, thickness about 0.20λ
Support substrate 2: material silicon, crystal orientation (−45°, −90°, 80°)
Low-acoustic-velocity film 14: material SiO$_2$, thickness about 0.15λ, or about 0.2λ
IDT electrode 6: material Al, thickness about 0.025λ
Wavelength λ: about 1 μm FIG. 19 is a diagram showing phase characteristics of respective acoustic wave devices including the features of Preferred Embodiment 2. FIG. 20 is an enlarged view showing the phase characteristics of respective acoustic wave devices including the features of Preferred Embodiment 2. In FIGS. 19 and 20, a solid line indicates a result when the thickness of the low-acoustic-velocity film is about 0.15λ, which is thinner than the piezoelectric layer. A broken line indicates a result when the thickness of the low-acoustic-velocity film is about 0.2λ which is the same or substantially the same as the thickness of the piezoelectric layer.

As shown in FIGS. 19 and 20, when the low-acoustic-velocity film is thinner than the piezoelectric layer, the maximum phase level of a spurious emission at about 4.5 GHz to about 7 GHz is further significantly reduced or prevented as compared with a case where the low-acoustic-velocity film has the same or substantially the same thickness as the piezoelectric layer. By thinning the low-acoustic-velocity film, lowering a velocity of the plate wave mode due to the low-acoustic-velocity film is significantly reduced or prevented, and the spurious modes are more easily leaked to the support substrate.

Further, a plurality of acoustic wave devices each including the features of Preferred Embodiment 2 were manufactured with different thicknesses of the low-acoustic-velocity film. Note that, in these acoustic wave devices, the thicknesses of the piezoelectric layer are different from those of the acoustic wave devices in which the phase characteristics are shown in FIGS. 19 and 20.

Conditions for respective acoustic wave devices including the features of Preferred Embodiment 2 are as follows.

Figure 21:
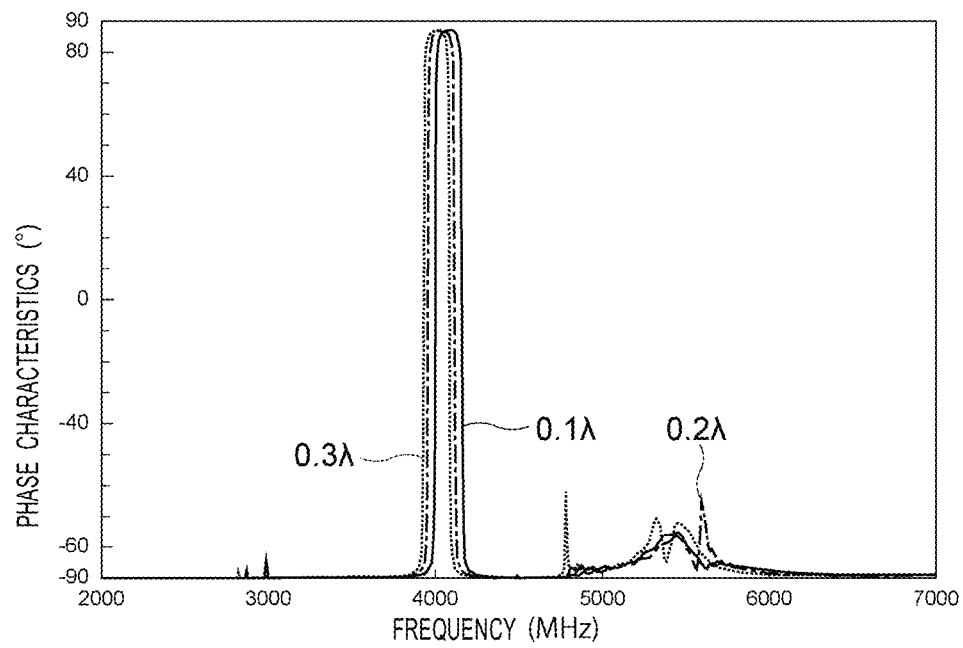
FIG. 21 is a diagram showing phase characteristics of respective acoustic wave devices including the features of Preferred Embodiment 2 of the present invention.
Figure 22:
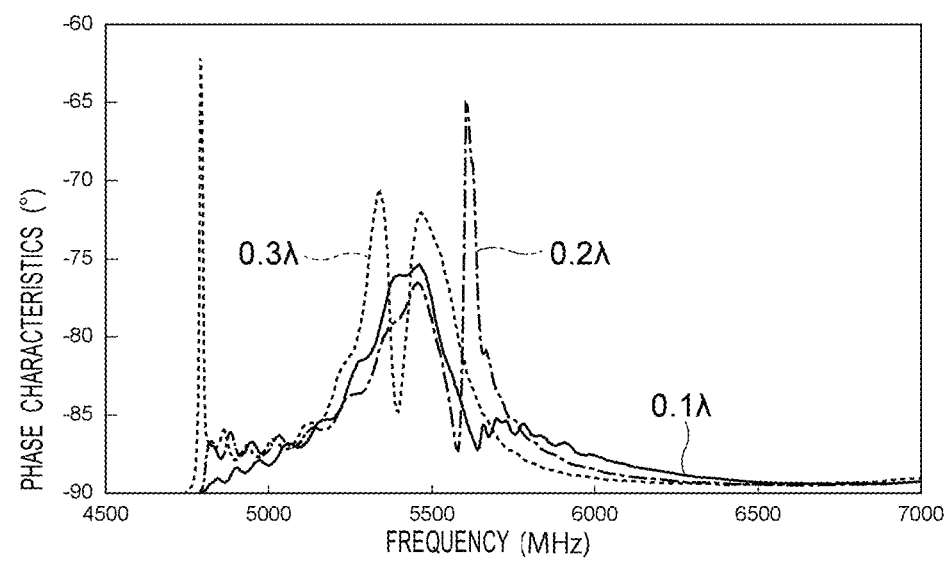
FIG. 22 is an enlarged view showing the phase characteristics of the respective acoustic wave devices including the features of Preferred Embodiment 2 of the present invention.

Piezoelectric layer 5: material lithium tantalate, cut-angles 50° Y, thickness about 0.30λ
Support substrate 2: material silicon, crystal orientation (−45°, −54.7°, 45°)
Low-acoustic-velocity film 14: material SiO$_2$, thickness about 0.1λ, about 0.2λ, or about 0.3λ
IDT electrode 6: material Al, thickness about 0.04λ
Wavelength λ: about 1 μm FIG. 21 is a diagram showing phase characteristics of respective acoustic wave devices including the features of Preferred Embodiment 2. FIG. 22 is an enlarged view showing phase characteristics of respective acoustic wave devices including the features of Preferred Embodiment 2. In FIGS. 21 and 22, a solid line indicates a result when the thickness of the low-acoustic-velocity film is about 0.1λ, which is thinner than the piezoelectric layer. A long and short dashed line indicates a result when the thickness of the low-acoustic-velocity film is about 0.2λ, which is thinner than the piezoelectric layer. A broken line indicates a result when the thickness of the low-acoustic-velocity film is about 0.3λ which is the same or substantially the same as the thickness of the piezoelectric layer.

As shown in FIGS. 21 and 22, when the low-acoustic-velocity film is thinner than the piezoelectric layer, the maximum phase level of a spurious emission at about 4.5 GHz to about 7 GHz is further significantly reduced or prevented as compared with the case where the low-acoustic-velocity film has the same or substantially the same thickness as the piezoelectric layer. As shown in FIGS. 19 to 22, the spurious modes are able to be further significantly reduced or prevented by thinning the low-acoustic-velocity film than the piezoelectric layer regardless of the thickness of the piezoelectric layer. Further, the thickness of the low-acoustic-velocity film is preferably thin, for example, so that the spurious modes are able to be further significantly reduced or prevented.

A thickness of the piezoelectric layer 5 is preferably about 0.15λ or less, for example. Thus, the spurious modes are able to be further significantly reduced or prevented. This will be described below.

Figure 11:
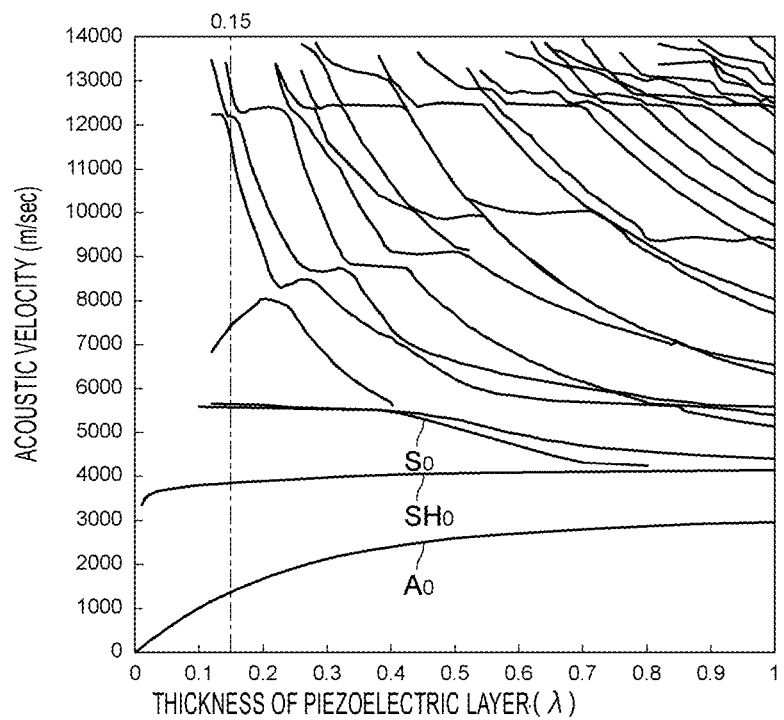
FIG. 11 is a diagram showing dispersion relation of plate wave modes in the piezoelectric layer.

FIG. 11 is a diagram showing dispersion relation of plate wave modes in the piezoelectric layer. Note that FIG. 11 shows an example in which the piezoelectric layer is made of 36° YX—LiTaO$_3$.

As shown in FIG. 11, when the thickness of the piezoelectric layer 5 is about 0.15λ or less, modes, which are spurious emissions in modes other than the A$_0$ mode and the S$_0$ mode, are hardly excited. The acoustic velocity of the A$_0$ mode approaches 0 m/sec as the piezoelectric layer 5 becomes thinner. On the other hand, even when the modes, which are spurious emissions in modes other than the A$_0$ mode and the S$_0$ mode, are excited, acoustic velocities often exceed 10000 m/sec. Therefore, the spurious modes are unlikely to occur up to about twice the frequency of the SH$_0$ mode which is the main mode.

Here, impedance frequency characteristics and a return loss of a Modification of Preferred Embodiment 2 in which the thickness of the piezoelectric layer 5 is set to about 0.15λ or less are shown. Conditions of an acoustic wave device of the present modification are as follows.

Figure 12:
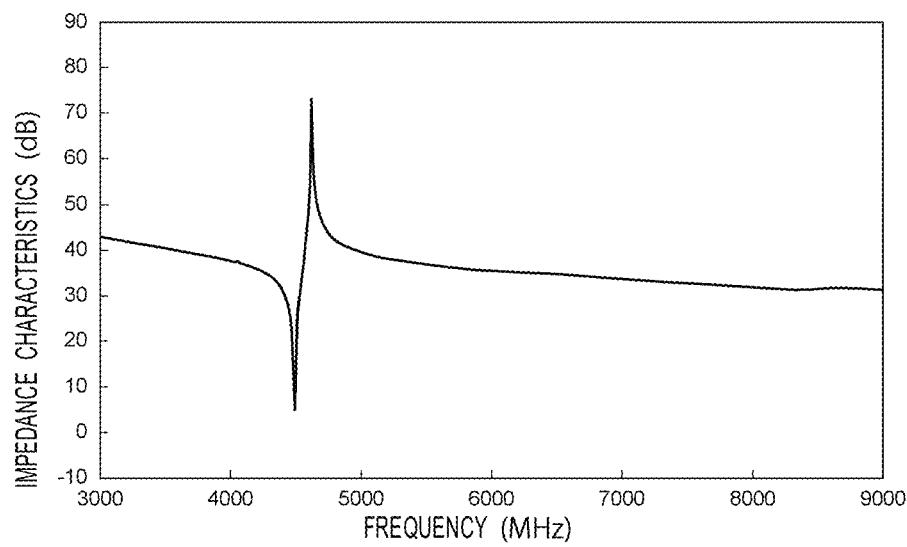
FIG. 12 is a diagram showing impedance frequency characteristics of an acoustic wave device according to a Modification of Preferred Embodiment 2 of the present invention.
Figure 13:
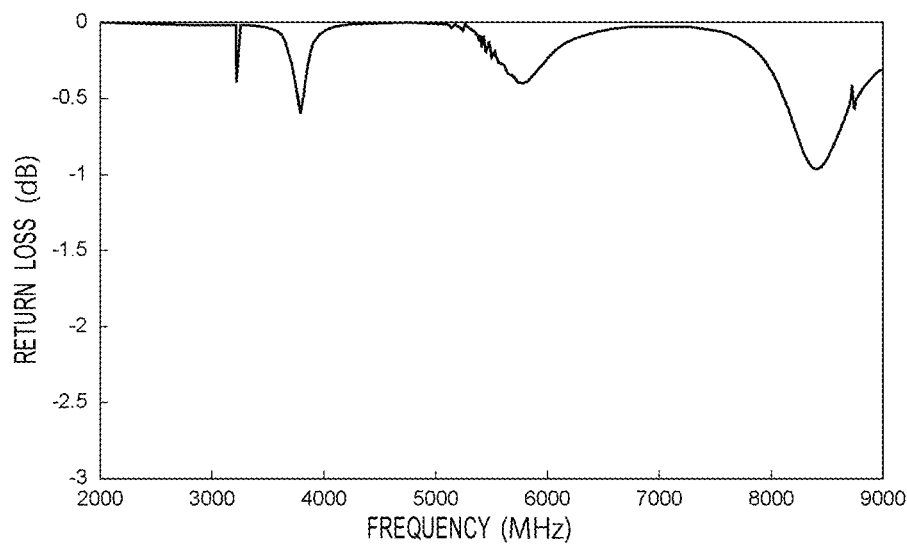
FIG. 13 is a diagram showing a return loss of the acoustic wave device according to the Modification of Preferred Embodiment 2 of the present invention.

Piezoelectric layer 5: material lithium tantalate, cut-angles about 50° Y, thickness about 0.10λ
Support substrate 2: material silicon, crystal orientation (−45°, −54.7°, 30°)
Low-acoustic-velocity film 14: material SiO$_2$, thickness about 0.1λ
IDT electrode 6: material Al, thickness about 0.08λ
Wavelength λ: about 1 μm FIG. 12 is a diagram showing the impedance frequency characteristics of the acoustic wave device according to the Modification of Preferred Embodiment 2. FIG. 13 is a diagram showing the return loss of the acoustic wave device according to the Modification of Preferred Embodiment 2.

As shown in FIG. 12, spurious modes are significantly reduced or prevented at frequencies of about 0.5 times or more and about 2.2 times or less than the main mode in the Modification of Preferred Embodiment 2. As described above, since the thickness of the piezoelectric layer 5 is about 0.15λ or less, spurious emissions in modes other than the $S_0$ mode are able to be significantly reduced or prevented, and the spurious emission due to the $S_0$ mode is able to be significantly reduced or prevented as in Preferred Embodiment 2. As shown in FIG. 13, no loss or substantially no loss occurs with an absolute value larger than 1 dB.

Figure 14:
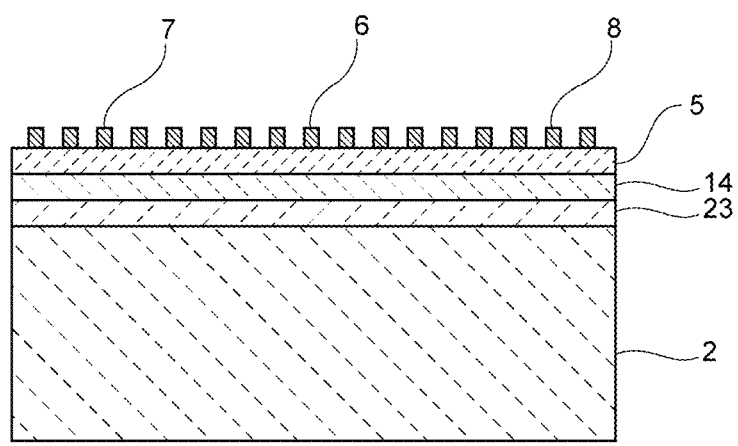
FIG. 14 is a front sectional view of an acoustic wave device according to Preferred Embodiment 3 of the present invention.

FIG. 14 is a front sectional view of an acoustic wave device according to Preferred Embodiment 3.

Preferred Embodiment 3 is different from Preferred Embodiment 2 in that between the support substrate 2 and the low-acoustic-velocity film 14, a high-acoustic-velocity film 23 is provided in which the acoustic velocity of the bulk wave propagating therethrough is higher than the acoustic velocity of the acoustic wave propagating through the piezoelectric layer 5. Thicknesses of the piezoelectric layer 5 and the low-acoustic-velocity film 14 and a crystal orientation of the support substrate 2 are different from those of Preferred Embodiment 2. Except for the above points, the acoustic wave device of Preferred Embodiment 3 includes the same or similar features as the acoustic wave device of Preferred Embodiment 2.

The high-acoustic-velocity film 23 is made of silicon nitride (SiN). Note that the high-acoustic-velocity film 23 may be made of any one of, for example, piezoelectric material such as aluminum nitride, aluminum oxide, silicon carbide, silicon oxynitride, silicon, DLC film, silicon, sapphire, lithium tantalate, lithium niobate, quartz, and the like, various ceramics such as alumina, zirconia, cordierite, mullite, steatite, forsterite, and the like, diamond, magnesia, a material mainly including each of the above-described materials, and a material mainly including a mixture of the above-mentioned materials. The material of the high-acoustic-velocity film 23 is preferably a material having a relatively high acoustic velocity, for example.

Conditions of the acoustic wave device of Preferred Embodiment 3 are as follows.

Piezoelectric layer 5: material lithium tantalate, cut-angles about 50° Y, thickness about 0.20λ

Support substrate 2: material silicon, crystal orientation (−45°, −54.7°, 30°)

Low-acoustic-velocity film 14: material $SiO_2$, thickness about 0.225λ

High-acoustic-velocity film 23: material SiN, thickness about 0.4λ

IDT electrode 6: material Al, thickness about 0.08λ

Wavelength λ: about 1 μm

Since acoustic velocities at which respective modes are spurious emissions propagating through the high-acoustic-velocity film 23 are high, the above respective modes may be further leaked to the support substrate 2 side. Therefore, the spurious modes are able to be significantly reduced or prevented. Note that the $SH_0$ mode, which is the main mode, may be substantially confined to the piezoelectric layer 5 side. This will be explained in FIGS. 15 and 16 below. Note that, an acoustic wave device according to a Modification of Preferred Embodiment 3 including the same or similar features as that of Preferred Embodiment 3 except that the Modification of Preferred Embodiment 3 has no high-acoustic-velocity film was prepared.

Figure 15:
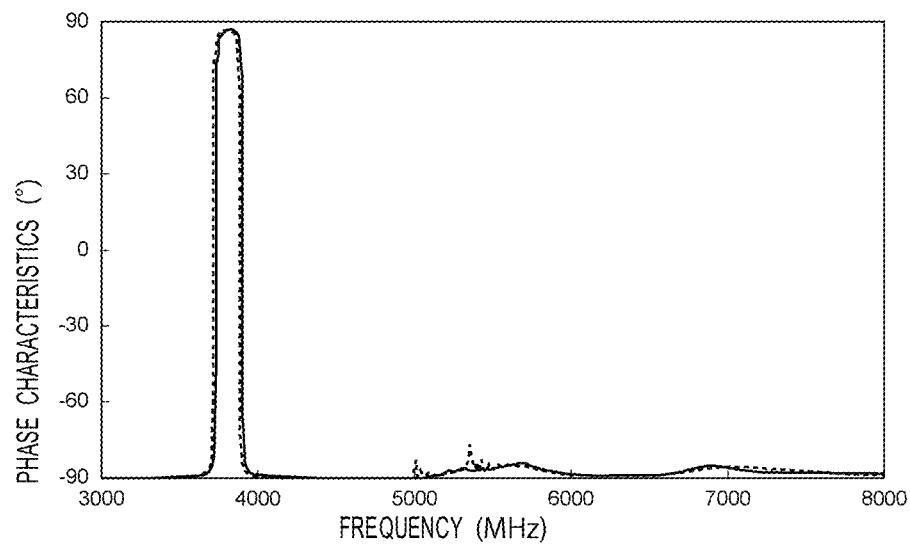
FIG. 15 is a diagram showing phase characteristics of the acoustic wave devices of Preferred Embodiment 3 and a Modification thereof of the present invention.
Figure 16:
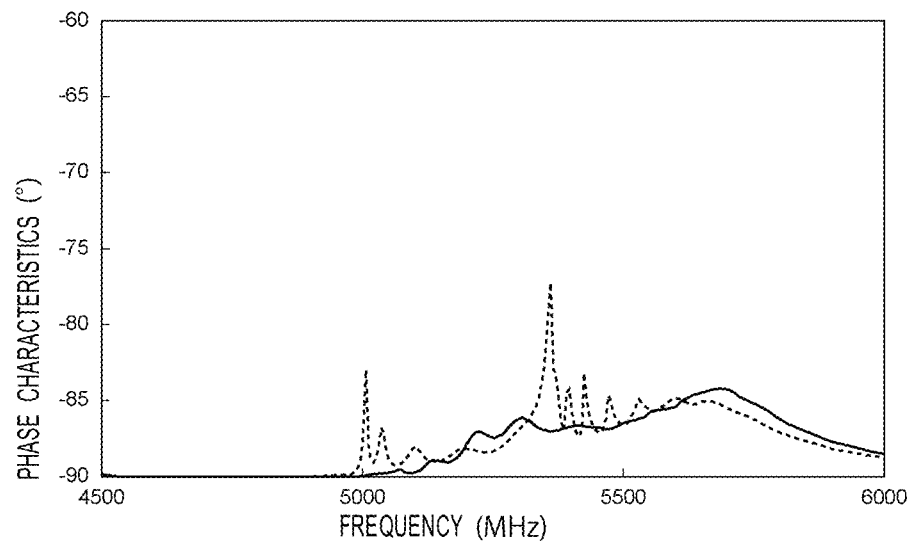
FIG. 16 is an enlarged view showing the phase characteristics of the acoustic wave devices according to Preferred Embodiment 3 and the Modification thereof of the present invention.

FIG. 15 is a diagram showing phase characteristics of the acoustic wave devices of Preferred Embodiment 3 and the Modification thereof. FIG. 16 is an enlarged view showing phase characteristics of the acoustic wave devices according to Preferred Embodiment 3 and the Modification thereof. In FIGS. 15 and 16, a solid line indicates a result of Preferred Embodiment 3, and a broken line indicates result of the Modification.

As shown in FIG. 15, in Preferred Embodiment 3, the phase characteristics are close to 90° around 3700 MHz to 4000 MHz. Therefore, an insertion loss is low. The same or similar features apply to the Modification.

As shown in FIGS. 15 and 16, at around 5000 MHz, although spurious modes are able to be significantly reduced or prevented in the Modification, spurious modes are able to be further significantly reduced or prevented in Preferred Embodiment 3.

Hereinafter, Preferred Embodiment 4 will be described. Preferred Embodiment 4 is different from Preferred Embodiment 3 in that the piezoelectric layer 5 includes lithium niobate. Thicknesses of the low-acoustic-velocity film 14 and the high-acoustic-velocity film 23 and a crystal orientation of the support substrate 2 are also different from those of Preferred Embodiment 3. Except for the above points, an acoustic wave device of Preferred Embodiment 4 includes the same or similar features as the acoustic wave device of Preferred Embodiment 3.

Conditions of the acoustic wave device of Preferred Embodiment 4 are as follows.

Piezoelectric layer 5: material lithium niobate, cut-angles 30° Y, thickness about 0.30λ

Support substrate 2: material silicon, crystal orientation (−45°, −90°, 35°)

Low-acoustic-velocity film 14: material $SiO_2$, thickness about 0.3λ

High-acoustic-velocity film 23: material SiN, thickness about 0.1λ

IDT electrode 6: material Al, thickness about 0.08λ

Wavelength λ: about 1 μm

Also in Preferred Embodiment 4, spurious modes are able to be significantly reduced or prevented as in Preferred Embodiment 3. This will be explained in the following by comparing Preferred Embodiment 4 with Comparative Example 5. Note that Comparative Example 5 is different from Preferred Embodiment 4 in that a crystal orientation of the support substrate is a crystal orientation (0°, 0°, 0°).

Figure 17:
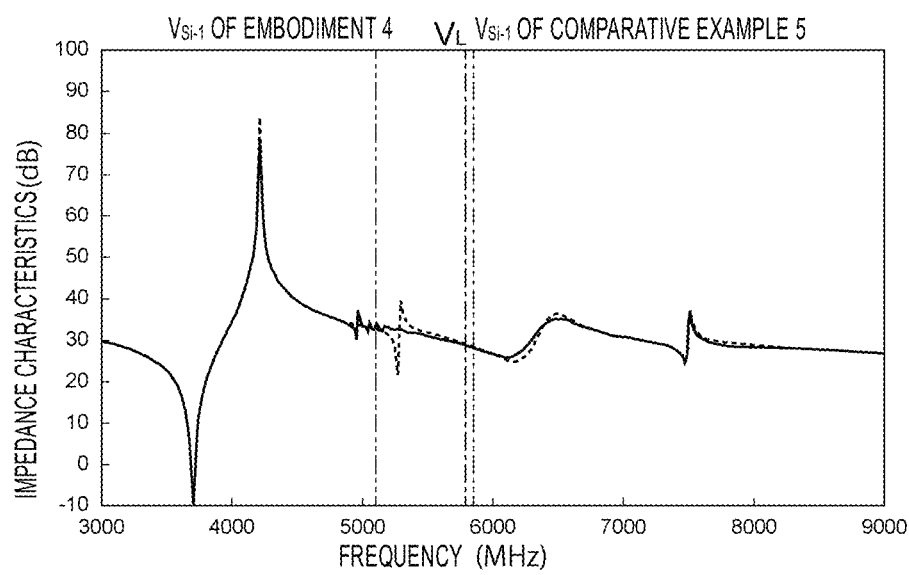
FIG. 17 is a diagram showing impedance frequency characteristics of acoustic wave devices of Preferred Embodiment 4 and Comparative Example 5 of the present invention.

FIG. 17 is a diagram showing impedance frequency characteristics of the acoustic wave devices of Preferred Embodiment 4 and Comparative Example 5. In FIG. 17, a solid line indicates a result of Preferred Embodiment 4, and a broken line indicates result of Comparative Example 5.

In Comparative Example 5, a large spurious mode occurs at around 5400 MHz. On the other hand, in Preferred Embodiment 4, a spurious mode is significantly reduced or prevented. In Preferred Embodiment 4, the acoustic velocity $V_{Si-1}$ is lower than that of Comparative Example 5, and is set to about 5100 m/sec. As described above, since the crystal orientation of the support substrate 2 is selected 1 to satisfy Unequal Equation (2), the spurious modes are able to be significantly reduced or prevented.

$$V_{Si-1} \leq V_L \quad \text{Unequal Equation (2)}$$

The film thickness of the high-acoustic-velocity film 23 is preferably about 0.1λ or more and about 0.6λ or less, for example. Accordingly, modes, which are spurious emissions, are more easily leaked to the support substrate 2 side. Therefore, the spurious modes are able to be further significantly reduced or prevented.

Figure 18:
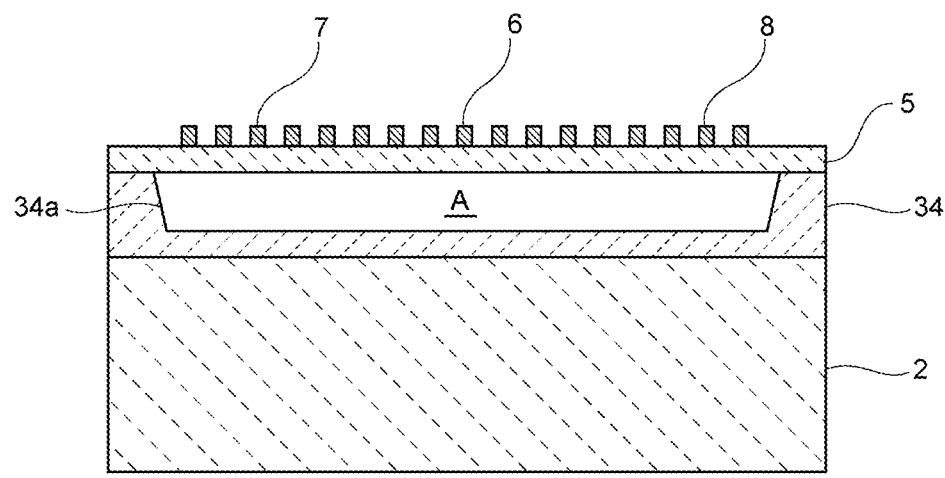
FIG. 18 is a front sectional view of an acoustic wave device according to Preferred Embodiment 5 of the present invention.

FIG. 18 is a front sectional view of an acoustic wave device according to Preferred Embodiment 5.

Preferred Embodiment 5 is different from Preferred Embodiment 1 in that a support 34 is provided between the support substrate 2 and the piezoelectric layer 5, and a cavity A is provided. Except for the above points, an acoustic wave device of Preferred Embodiment 5 includes the same or similar features as the acoustic wave device 1 of Preferred Embodiment 1.

The support 34 is provided with a recess 34a, and the piezoelectric layer 5 covers the recess 34a. Thereby, the cavity A surrounded by the support 34 and the piezoelectric layer 5 is provided. Although not particularly limited, the support 34 is made of silicon oxide in Preferred Embodiment 5.

Plate waves excited in the piezoelectric layer 5 are reflected to the piezoelectric layer 5 side at an interface between the piezoelectric layer 5 and the cavity A. On the other hand, modes, which are spurious emissions, may be leaked to the support substrate 2 side from the portion of the support 34 supporting the piezoelectric layer 5. Also in Preferred Embodiment 5, the spurious modes are able to be significantly reduced or prevented as in Preferred Embodiment 1.

Note that the support 34 does not necessarily need to be provided. Accordingly, a recess may be provided in the support substrate 2. By covering the recess with the piezoelectric layer 5, a cavity surrounded by the support substrate 2 and the piezoelectric layer 5 may be provided.

In each of the above preferred embodiments and the above modifications, an example in which the acoustic wave device is an acoustic wave resonator is described. The acoustic wave device of the present invention may be, for example, a ladder filter including an acoustic wave resonator, a longitudinally coupled resonator-type acoustic wave filter, or the like, or may be a multiplexer having a plurality of band-pass filters including an acoustic wave resonator or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate made of silicon;
   a piezoelectric layer directly or indirectly on the support substrate; and
   an interdigital transducer (IDT) electrode on the piezoelectric layer; wherein
   when a wavelength defined by an electrode finger pitch of the IDT electrode is $\lambda$, a thickness of the piezoelectric layer is about $1\lambda$ or less; and
   $V_L$, which is an acoustic velocity of a longitudinal wave component of a bulk wave propagating through the piezoelectric layer, satisfies Unequal Equation (2) below in relation to an acoustic velocity $V_{Si-1}$ determined by Equation (1) below:

$$V_{Si-1} = (V_2)^{1/2} \text{ (m/sec)} \quad \text{Equation (1);}$$

$$V_{Si-1} \leq V_L \quad \text{Unequal Equation (2);}$$

$V_2$ in Equation (1) is a solution of Equation (3);

$$Ax^3 + Bx^2 + Cx + D = 0 \quad \text{Equation (3);}$$

$V_1$, $V_2$, and $V_3$, which are three solutions of Equation (3), have a relationship of $V_1 \leq V_2 \leq V_3$;
   in Equation (3), A, B, C, and D are values determined by following Equations (3A), (3B), (3C), and (3D) below, respectively:

$$A = -\rho^3 \quad \text{Equation (3A);}$$

$$B = \rho^2 (L_{11} + L_{22} + L_{33}) \quad \text{Equation (3B);}$$

$$C = \rho(L_{21}^2 + L_{23}^2 + L_{31}^2 - L_{11} \cdot L_{33} - L_{22} \cdot L_{33} - L_{11} \cdot L_{22}) \quad \text{Equation (3C); and}$$

$$D = 2 \cdot L_{21} \cdot L_{23} \cdot L_{31} + L_{11} \cdot L_{22} \cdot L_{33} - L_{31}^2 \cdot L_{22} - L_{11} \cdot L_{23}^2 - L_{21}^2 \cdot L_{33} \quad \text{Equation (3D);}$$

in Equations (3A), (3B), (3C), or (3D), $\rho$ represents a density (g/cm$^3$) of silicon, and $L_{11}$, $L_{22}$, $L_{33}$, $L_{21}$, $L_{31}$, and $L_{23}$ are values determined by Equations (4A), (4B), (4C), (4D), (4E), and (4F) below, respectively:

$$L_{11} = c_{11} \cdot a_1^2 + c_{44} \cdot a_2^2 + c_{44} \cdot a_3^2 \quad \text{Equation (4A);}$$

$$L_{22} = c_{44} \cdot a_1^2 + c_{11} \cdot a_2^2 + c_{44} \cdot a_3^2 \quad \text{Equation (4B);}$$

$$L_{33} = c_{44} \cdot a_1^2 + c_{44} \cdot a_2^2 + c_{11} \cdot a_3^2 \quad \text{Equation (4C);}$$

$$L_{21} = (c_{12} + c_{44}) \cdot a_2 \cdot a_1 \quad \text{Equation (4D);}$$

$$L_{31} = (c_{12} + c_{44}) \cdot a_1 \cdot a_3 \quad \text{Equation (4E); and}$$

$$L_{23} = (c_{44} + c_{12}) \cdot a_3 \cdot a_2 \quad \text{Equation (4F);}$$

in Equations (4A), (4B), (4C), (4D), (4E), and (4F), $c_{11}$, $c_{12}$, and $c_{44}$ are elastic constants (N/m$^2$) of silicon, respectively, and $a_1$, $a_2$, and $a_3$ are values determined by Equations (5A), (5B), and (5C) below, respectively:

$$a_1 = \cos(\varphi) \cdot \cos(\psi) - \sin(\varphi) \cdot \cos(\theta) \cdot \sin(\psi) \quad \text{Equation (5A);}$$

$$a_2 = \sin(\varphi) \cdot \cos(\psi) + \cos(\varphi) \cdot \cos(\theta) \cdot \sin(\psi) \quad \text{Equation (5B); and}$$

$$a_3 = \sin(\theta) \cdot \sin(\psi) \quad \text{Equation (5C);}$$

where $\varphi$, $\theta$, and $\psi$ in Equations (5A), (5B), and (5C) are $\varphi$, $\theta$, and $\psi$ in a silicon crystal orientation ($\varphi$, $\theta$, $\psi$).

2. The acoustic wave device according to claim 1, wherein $V_L$, which is the acoustic velocity of the longitudinal wave component of the bulk wave propagating through the piezoelectric layer, satisfies Unequal Equation (7) below in relation to an acoustic velocity $V_{Si-2}$ determined by Equation (6) below:

$$V_{Si-2} = (V_3)^{1/2} \text{ (m/sec)} \quad \text{Equation (6)}$$

$$V_{Si-2} \leq V_L \quad \text{Unequal Equation (7).}$$

3. The acoustic wave device according to claim 1, wherein an acoustic velocity $V_{SH0}$ of an SH$_0$ mode propagating through the piezoelectric layer and $V_L$, which is the acoustic velocity of the longitudinal wave component of the bulk wave propagating through the piezoelectric layer, satisfy following Unequal equation (8) below in relation to the acoustic velocity $V_{Si-1}$ determined by the Unequal Equation (2):

$$V_{SH0} \leq V_{Si-1} \leq V_L \quad \text{Unequal Equation (8).}$$

4. The acoustic wave device according to claim 1, wherein a low-acoustic-velocity film is provided between the support substrate and the piezoelectric layer; and
   an acoustic velocity of a bulk wave propagating through the low-acoustic-velocity film is lower than an acoustic velocity of the bulk wave propagated through the piezoelectric layer.

5. The acoustic wave device according to claim 4, wherein a high-acoustic-velocity film is provided between the support substrate and the low-acoustic-velocity film; and
   an acoustic velocity of a bulk wave propagating through the high-acoustic-velocity film is higher than the acoustic velocity of the acoustic wave propagating through the piezoelectric layer.

6. The acoustic wave device according to claim 5, wherein a thickness of the high-acoustic-velocity film is about 0.6λ or less.

7. The acoustic wave device according to claim 4, wherein a thickness of the low-acoustic-velocity film is about 2λ or less.

8. The acoustic wave device according to claim 4, wherein a thickness of the low-acoustic-velocity film is substantially equal to or less than the thickness of the piezoelectric layer.

9. The acoustic wave device according to claim 1, wherein a cavity is provided between the support substrate and the piezoelectric layer.

10. The acoustic wave device according to claim 1, wherein the piezoelectric layer includes lithium tantalate.

11. The acoustic wave device according to claim 1, wherein the piezoelectric layer is made of lithium niobate.

12. The acoustic wave device according to claim 1, wherein the thickness of the piezoelectric layer is about 0.15λ or less.

13. The acoustic wave device according to claim 1, wherein a first reflector and a second reflector are provided on opposing sides of the IDT electrode in an acoustic wave propagation direction.

14. The acoustic wave device according to claim 1, wherein the IDT electrode includes aluminum.

15. The acoustic wave device according to claim 1, wherein a dielectric film is provided on the IDT electrode.

16. The acoustic wave device according to claim 1, a thickness of the IDT electrode 6 is between about 0.025λ and about 0.08λ.

17. The acoustic wave device according to claim 4, wherein a thickness of the low-acoustic-velocity film is between about 0.15λ and about 0.3λ.

* * * * *